United States Patent [19]

Nieman et al.

[11] Patent Number: 5,386,870
[45] Date of Patent: Feb. 7, 1995

[54] HIGH THERMAL CONDUCTIVITY CONNECTOR HAVING HIGH ELECTRICAL ISOLATION

[75] Inventors: Ralph C. Nieman, Downers Grove; John D. Gonczy, Oak Lawn; Thomas H. Nicol, St. Charles, all of Ill.

[73] Assignee: University of Chicago, Chicago, Ill.

[21] Appl. No.: 90,425

[22] Filed: Jul. 12, 1993

[51] Int. Cl.$^6$ .............................................. F28F 7/00
[52] U.S. Cl. ........................................ 165/1; 165/185
[58] Field of Search ................................ 165/185, 1

[56] References Cited

U.S. PATENT DOCUMENTS

| | | | |
|---|---|---|---|
| 3,249,680 | 5/1966 | Sheets et al. | 165/185 |
| 4,344,302 | 8/1982 | Jarrett, Jr. et al. | 165/185 |
| 4,450,693 | 5/1984 | Green et al. | 165/185 |
| 4,639,829 | 1/1987 | Ostergren et al. | 165/185 |
| 4,646,263 | 2/1987 | Ngo et al. | 165/185 |
| 4,696,169 | 9/1987 | Niemann et al. | |
| 5,010,949 | 4/1991 | Dehaine | 165/185 |

*Primary Examiner*—A. Michael Chambers
*Attorney, Agent, or Firm*—Reinhart, Boerner, Van Deuren, Norris & Rieselbach

[57] ABSTRACT

A method and article for providing a low-thermal-resistance, high-electrical-isolation heat intercept connection. The connection method involves clamping, by thermal interference fit, an electrically isolating cylinder between an outer metallic ring and an inner metallic disk. The connection provides durable coupling of a heat sink and a heat source.

20 Claims, 4 Drawing Sheets

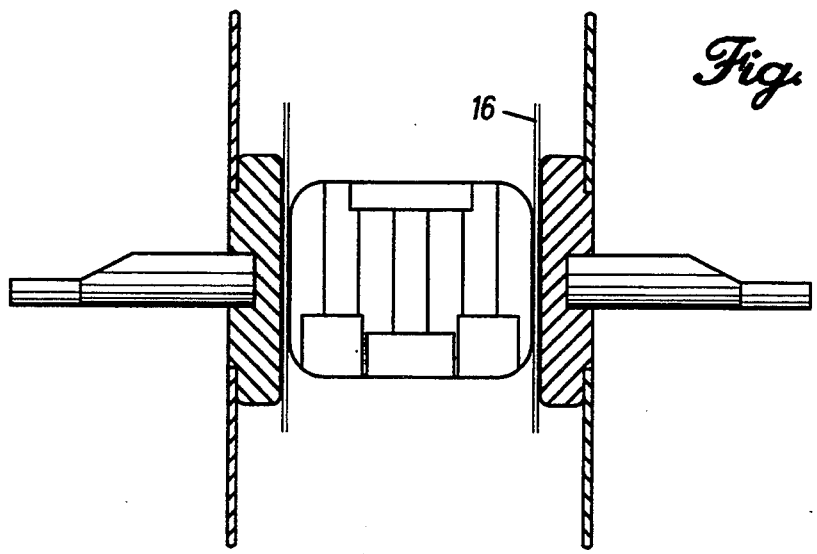
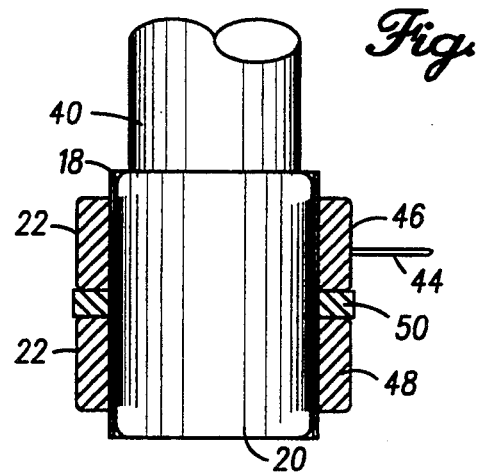
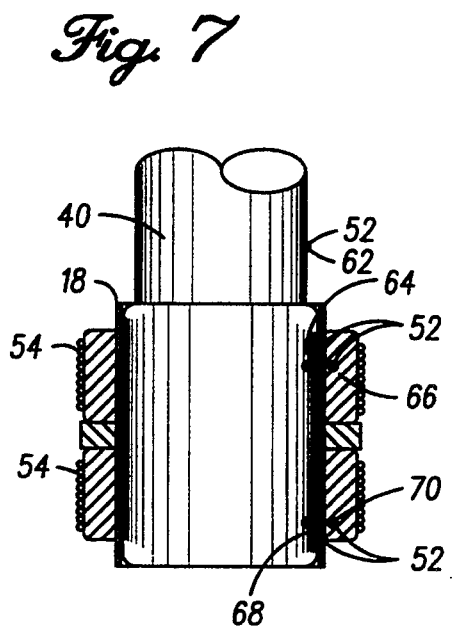
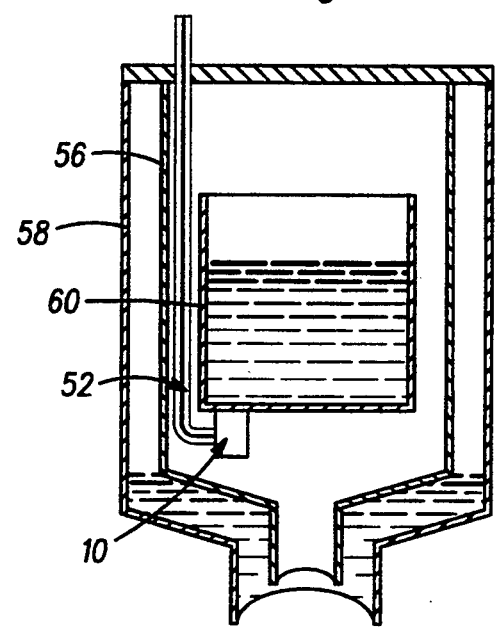

HIGH THERMAL CONDUCTIVITY CONNECTOR HAVING HIGH ELECTRICAL ISOLATION

BACKGROUND OF THE INVENTION

The present invention relates generally to heat sink connectors. More particularly, the present invention relates to heat sink connectors having high thermal conductivity and at the same time also having high electrical isolation.

In the operation of many electrical devices, heat is generated by the operation of the device itself and must be removed. Heat removal can be accomplished using a heat transferring connector to mechanically join the electrical current carrying conductor or surface to a heat sink which is cooled by a coolant bath or refrigeration source. It is highly desirable that the connector has high electrical isolation, so that a flow of current will not interfere with the operation of the electrical device.

Additionally, electrical current carrying conductors and surfaces often require the removal of heat as a part of their normal operation. The heat removal of these conductors and surfaces can also be accomplished by a mechanical connection to a heat sink that is cooled by a coolant bath or by a refrigeration source. Such connections ideally provide both effective removal of heat (high thermal conductivity) and effective electrical isolation (high electrical resistivity and high dielectric strength). Such connections should be straightforward to implement and provide reliable performance independent of operating temperature for long periods of time.

It is therefore an object of the invention to provide a novel method and apparatus for providing a heat sink connection having both high thermal conductivity and high electrical isolation.

It is a further object of the invention to provide an improved heat sink connection having effective performance over a wide operating temperature range.

It is a still further object of the invention to provide a novel heat sink connection capable of performing effectively for long periods of time.

It is another object of the invention to provide an improved heat sink connection that is straightforward to construct and capable of being manufactured at a reasonable cost.

It is an additional object of the invention to provide a novel method and apparatus suitable for intercepting heat transferred to a high temperature superconductor (HTS) lead from a conventional lead.

It is a further object of the invention to provide an improved method and apparatus for constructing a durable heat sink connection.

It is an additional object of the invention to provide a novel method and apparatus for intercepting heat produced by a heat source which is assembled using thermal interference fitting.

It is still a further object of the invention to provide a novel heat sink connector having material compatibility with the object to be cooled, thereby helping to prevent undesirable chemical reaction between the connector, the heat sink and the object to be cooled.

It is an additional object of the invention to provide an improved heat sink connector having suitable mechanical properties over the desired operating temperature range, thereby preventing melting, undesirable bonding with the object to be cooled or the heat sink, and incompatible thermal expansion of the connector.

Other advantages and features of the invention, together with the organization and the manner of operation thereof, will become apparent from the following detailed description when taken in conjunction with the accompanying drawings, wherein like elements have like numerals throughout the drawings.

BRIEF DESCRIPTION OF THE DRAWINGS

FIG. 4 shows a connector suitable for high temperature superconducting material lead heat interception;

FIG. 6 shows further detail of the prototype connector assembly;

FIG. 7 illustrates the instrumentation of the prototype connector;

FIG. 8 shows an example installation of the prototype connector;

DESCRIPTION OF PREFERRED EMBODIMENTS

Figure 1A:
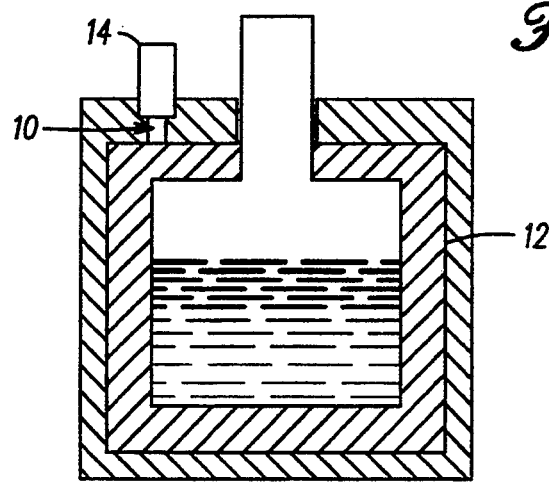
FIG. 1A illustrates a connection of a metallic heat shield to a refrigeration source and FIG. 1B is a metallic tube connection to a refrigeration source.
Figure 1B:
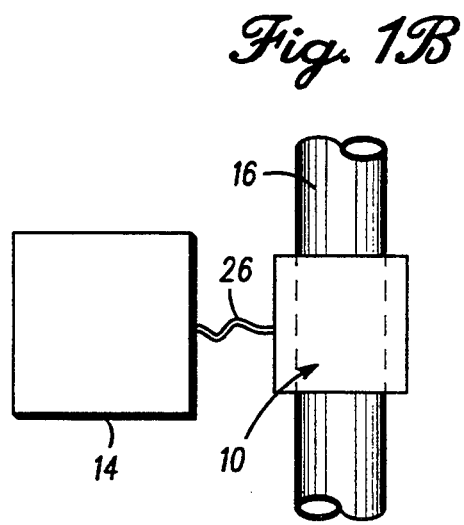

Referring to the figures and more particularly to FIG. 1, a connection system constructed in accordance with the invention is indicated generally at 10. One application of such a connection system includes the connection of a metallic heat shield 12 to a refrigeration source 14 (see FIG. 1A) and the connection of a metallic tube 16 to a refrigeration source 14 as shown in FIG. 1B. Further details of shrink fit technology can be found in U.S. Pat. No. 4,696,169 entitled Cryogenic Support Member, which is incorporated herein in its entirety.

Figure 2:
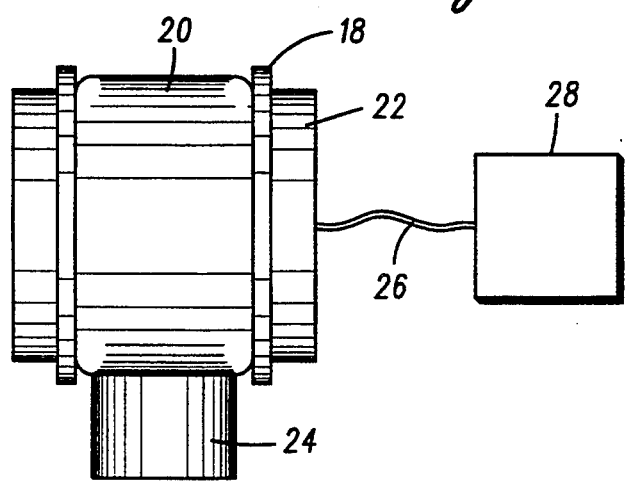
FIG. 2 shows a connector constructed in accordance with one form of the invention.

As shown in FIG. 2, a preferred embodiment of the present invention comprises an electrical isolating tube 18 which is clamped by means of thermal interference fit between an inner metallic disk 20 and an outer metallic rings 22. The isolating tube 18 can comprise plastic film, composite or ceramic, depending on, for example, the desired electrical resistivity, dielectric strength and mechanical properties over the operating temperature range. The disk 20 and ring 22 comprise metals with suitable thermal conductivity, having material compatibility with the object to be cooled and with the heat sink, and having suitable mechanical properties over the operating temperature range.

In order to provide a reliable and secure connection, a preferred fitting method is used. This method produces high thermal conductivity connections having high electrical isolation. The method involves clamping, by means of a thermal interference (shrink) fit, a thin electrical isolating cylinder 18 between an outer metallic ring 22 and an inner metallic disk 20. This method provides connections between the ring and the disk that have high thermal conductivity (low temperature difference) and high electrical isolation (low leakage current and high voltage isolation). The connections, by virtue of the interference fit, have controlled and repeatable performance, are rugged in nature and are suitable for applications at both low and high temperatures. The circular shape of the components enables straightforward fabrication with precision. Further, the preferred embodiments of the invention readily lend themselves to mass production manufacturing methods.

A preferred embodiment of the invention is shown in FIG. 2. An electrical isolating tube 18 is clamped between an inner metallic disk 20 and an outer metallic ring 22. The clamping is provided by a thermal interference (shrink) fit between the disk 20, tube 18 and ring 22. The metallic components 20 and 22 can be connected directly to a heat load or heat sink 24 or by an auxiliary conductor 26 to a heat load or heat sink 28.

The isolating tube 18 preferably comprises a composite or ceramic plastic film. As with other preferred embodiments of the invention, the material selection is preferably determined by electrical resistivity, dielectric strength and suitable mechanical properties over the operating temperature range. The tube 18 thickness is determined by electrical isolation considerations and fabrication considerations.

The disk 20 and ring 22 are preferably metals with suitable thermal conductivity, having material compatibility with the object to be cooled and with the heat sink 28, and having suitable mechanical properties over the operating temperature range. The disk 20, the tube 18 and the ring 22 dimensions are determined by the nature of the specific application and by the considerations of the thermal interference fit. The thermal interference fit is determined by the materials and geometry of the connection and the desired clamping force on the isolating tube. Further, the connection can be coupled to desired components by various methods which include mechanical clamping, soldering, welding and brazing.

Design Procedure

The preferred design procedure includes the following steps:

Specifying the application-specific geometry, such as isolating tube diameter, ring outer diameter, and connection length which can be limited by the particular application.

Specifying the electrical isolation considerations, such as electrical resistance and dielectric strength desired for acceptable heat source operation.

Specifying the heat flux across the connection.

Specifying the temperature range, including assembly and maximum and minimum operating temperatures.

Determining the isolating tube parameters. These are initially based on electrical isolation considerations. The tube material and thickness must provide the desired isolation with a margin of safety. The tube parameters are then reviewed mechanically. Included in the mechanical review are fabricability and electrical insulation integrity, i.e., voids, punch-through resistance, compressive strength, and the like.

Verifying the acceptability of the temperature drop across the tube for the design heat flux through the tube.

Determining the ring and disk materials. These materials are normally selected to yield high thermal and electrical conductivities and appropriate mechanical strength.

Figure 5:
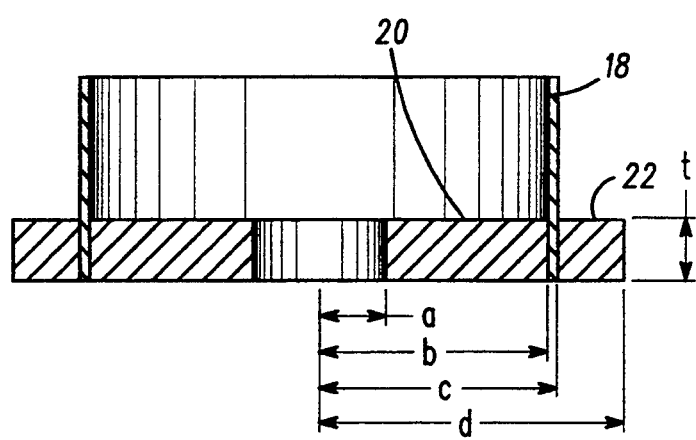
FIG. 5 illustrates another connector constructed in accordance with one form of the invention.

Determining the thermal-interference-fit parameters. A typical joint configuration is shown in FIG. 5. The fit, i.e., diametral interference, is normally designed to yield a high clamping force between the ring, tube, and disk without exceeding the compressive strength of the tube and the tensile yield strength of the ring. The equations that determine the clamping force on the tube are:

$P_i$, $P_o$ = inner and outer interface pressures, respectively, and are given by $$P_i = \frac{P_o(k_4 + k_5) - \delta_o}{k_6} \quad (1)$$

$$P_o = \frac{\delta_i k_6 + \delta_o(k_1 + k_2)}{(k_4 + k_5)(k_1 + k_2) - k_3 k_6} \quad (2)$$

where $\delta_i$, $\delta_o$ = inner and outer interface radial interference fits, respectively, and $k_1$–$k_6$ = constant parameters determined by the joint geometry and material properties and are given by $$k_1 = \frac{b}{E_1}\left(\frac{b^2 + a^2}{b^2 - a^2}\right) - V_1;$$

$$k_2 = \frac{b}{E_2}\left(\frac{c^2 + b^2}{c^2 - b^2}\right) - V_2;$$

$$k_3 = \frac{b}{E_2}\left(\frac{2c^2}{c^2 - b^2}\right);$$

$$k_4 = \frac{c}{E_3}\left(\frac{d^2 + c^2}{d^2 - c^2}\right) - V_3;$$

$$k_5 = \frac{c}{E_2}\left(\frac{c^2 + b^2}{c^2 - b^2}\right) - V_2;$$

$$k_6 = \frac{c}{E_2}\left(\frac{2b^2}{c^2 - b^2}\right);$$

where $E_1$, $E_2$, $E_3$ = Young's modulus for the disk, tube, and ring respectively, and $V_1$, $V_2$, $V_3$ = Poisson's ratio for the disk, tube, and ring, respectively.

Developing a detailed fabrication design.

The design procedure must consider component material properties as assembly temperature through operational temperatures. Successful application of the design involves precision component machining and measurement, assembly tooling, and preserving electrical isolation of the ring/tube/disk interface.

Figure 3:
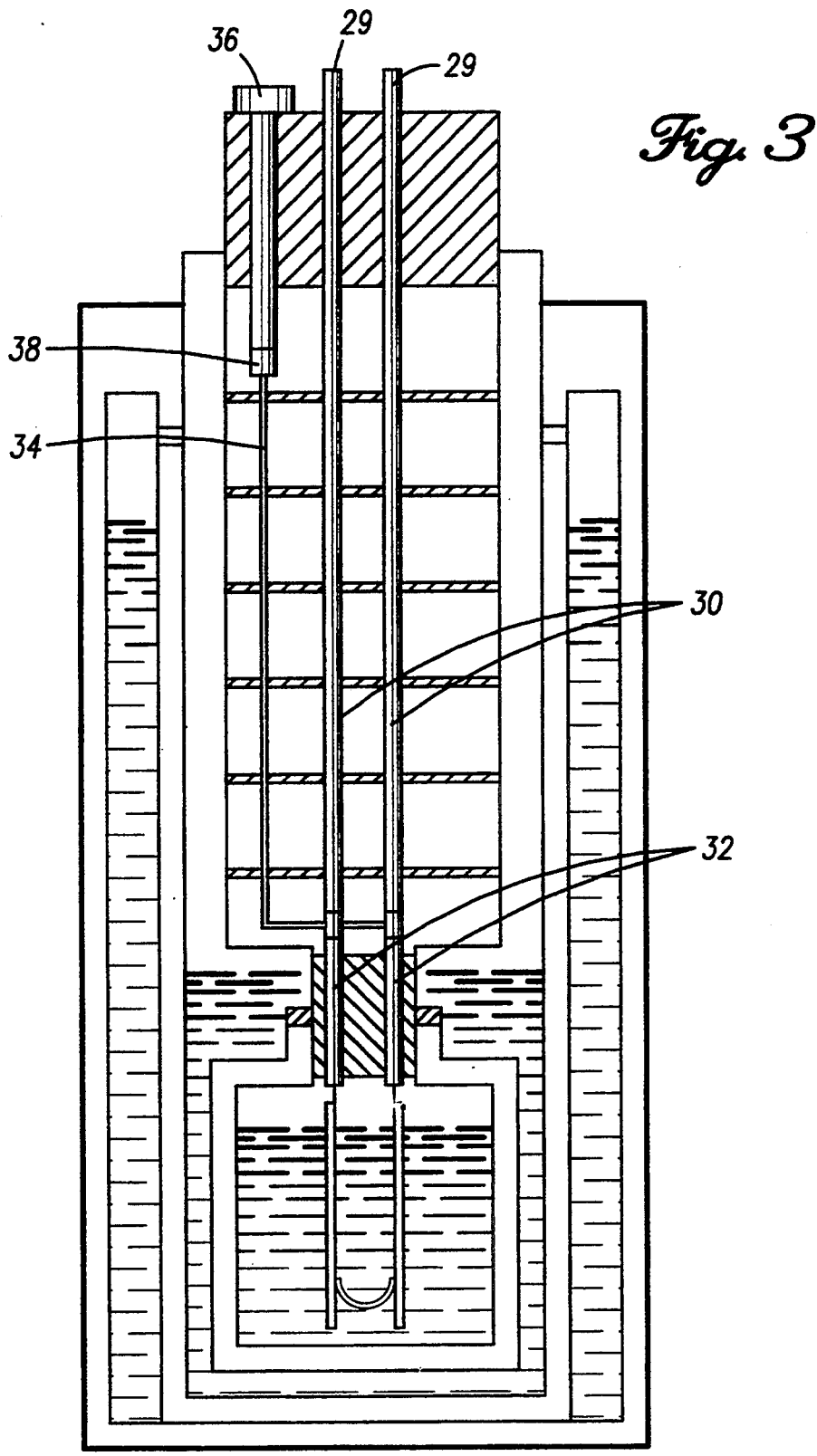
FIG. 3 illustrates a connector interfacing between a copper cable and a cold head heat exchanger of a mechanical refrigerator.

An exemplary measurement facility is shown in FIG. 3. Heat flux down the lead's conventional upper stage is intercepted at the transition to the lead's HTS lower stage. The intercepted heat is carried by copper cable to the cold-head heat exchanger of a mechanical refrigerator. A connection of the thermal interference type is the interface between the cable and the heat exchanger. The measurement facility design considerations are given in Table 1. The lead connection design considerations are illustrated in Table 2, and connection details are shown in FIG. 6.

Type EL Mylar was selected as the isolating tube material on the basis of this material's high dielectric strength, high resistivity, and availability. The tube consists of a single wrap of 0.0075 cm (0.003 in.) film applied to the disk. Predicted temperature drop across the tube is 1.5 K for 12 W heat transfer at 77 K with thermal conductivity of 0.01 W/cm K. ETP copper was selected as the ring and disk material. Selection was based on the material's high thermal conductivity, relatively high strength, and availability. The thermal interference fit is preferably accomplished with a ring which does not yield. This results in a 0.0025 cm (0.001 in.) diametral interference and develops a 20 MPa (3000 lb/in.$^2$) clamping pressure on the tube.

TABLE 1

CONNECTION DESIGN CONSIDERATIONS FOR CURRENT LEAD MEASUREMENT FACILITY.

| GEOMETRY | |
|---|---|
| Isolating tube diameter [cm (in.] | 3.81 (1.50) |
| Outer ring diameter [cm (in.)] | 6.35 (2.50) |
| Connection length [cm (in.)] | 5.08 (2.00) |
| ELECTRICAL ISOLATION | |
| Resistance [Ω] | 300$^a$ |
| Dielectric strength [V] | 125 |
| TEMPERATURE | |
| Assembly [K] | 300 K |
| Operating [K] | 60 ≦ T ≦ 80 |
| Heat Transfer [W] | 12$^b$ |

NOTES:
$^a$Corresponds to leakage current <0.1 A @ 30 V.
$^b$6 W per lead.

The assembly procedure involves cooling the disk with Mylar overwrap to 77 K with liquid nitrogen, heating the rings to 523 K (482° F.), and the inserting the disk-tube into the rings. Following assembly, the electrical isolation was verified at 300 K in air. The completed prototype connection is shown in FIG. 6.

The performance of the prototype connection was evaluated at 77 K in a vacuum. The disk was clamped with an indium gasket to the surface of a liquid nitrogen reservoir. The rings were wrapped with electrical heaters to simulate the current lead heat load. At steady state with a combined heater power input of W 2, the average (of both rings) temperature difference across the tube was 0.67 K. The predicted temperature difference was 0.25 K.

TABLE 2

CONNECTION DESIGN CONSEDERATIONS FOR SMES CURRENT LEAD.

| GEOMETRY | |
|---|---|
| Isolating tube diameter [cm (in.] | 6.35 (2.50) |
| Outer ring diameter [cm (in.)] | 8.89 (3.50) |
| Connection length [cm (in.)] | 5.08 (2.00) |
| ELECTRICAL ISOLATION | |
| Resistance [Ω] | 850,000$^a$ |
| Dielectric strength [V] | 8500 |
| TEMPERATURE | |
| Assembly [K] | 300 K |
| Operating [K] | 60 ≦ T ≦ 80 |
| Heat Transfer [W] | 45 |

NOTES:
$^a$Corresponds to leakage current <0.1 A @ 8500 V.

A composite equivalent to G10 CR epoxy fiberglass was selected as the isolating tube material. The selection was based on the material's high dielectric strength, high resistivity, and mechanical durability. The tube was fabricated as a wet lay-up on a mandrel and then machined to final outside diameter. The nominal tube thickness of 0.043 cm (0.017 in.) was determined by the 8500-V breakdown consideration and a fabrication consideration, i.e., minimum tube thickness.

The predicted temperature drop across the tube is 5.8 K for 45-W heat transfer with a thermal conductivity of 0.0028 W/cm K at 77 K. ETP copper was selected as the ring and disk material. Selection was based on the material's high thermal conductivity, relatively high strength, and availability.

In this preferred embodiment of the invention the thermal interference design resulted in a 0.0064 cm (0.0025 in.) diametral interference and developed a 22.9 MPa (3200 lb/in.$^2$) clamping pressure on the tube.

The assembly procedure involved preassembly of the tube into the ring with a snug fit; i.e., 0.0013 cm (0.0005 in.) interference. The disk was then cooled to 77 K with liquid nitrogen and inserted into the ring-tube subassembly. Following assembly, electrical isolation was verified at 300 K in air.

A preferred embodiment of the present invention shown in FIG. 3 has produced satisfactory results for heat intercepting of HTS current leads 29. As shown in FIG. 3, the heat flux down the lead's conventional upper stage 30 is intercepted at the transition to the lead's HTS lower stage 32. The intercepted heat is carried by copper cable 34 to the cold head heat exchanger 36 of a mechanical refrigerator. A connector 38 constructed in accordance with one form of this invention is the interface between the cable 34 and the heat exchanger 36.

The following non-limiting example illustrates various aspects of the invention.

EXAMPLE

A prototype connector 38 was designed and fabricated and its thermal performance was evaluated. Data were produced by monitoring the prototype connector 38 correlated conceptual thermal performance evaluations with actual results. This prototype connector is shown photographically in FIG. 4. The construction details, test procedures and results are as follows:

The connector 38 was assembled as shown in FIG. 6. A refrigeration source 40 comprised a liquid nitrogen reservoir or cryo cooler cold head. An ETP copper disk 20 was disposed about the circumference of the refrigeration source 40. An isolating tube 18 was disposed about the ETP copper disk 20. ETP copper rings 22 were positioned about the circumference of the isolating tube 18 which is disposed about the circumference of the refrigeration source 40. A current lead 44 was bolted to the outer diameter of the upper of the ETP copper rings 22. The upper copper ring 46 was separated from the lower copper ring 48 by a micarta separating washer 50. The assembly 10 was kept in a vacuum or gas environment. The rings 22, the isolating tube 18 and the ETP copper disk 20 were shrink fit to one another, thereby ensuring secure connections.

The assembly was instrumented with five thermocouples 52 as illustrated in FIG. 7. These thermocouples 52 were affixed to the refrigeration source 40, the isolating tube 18, the upper ETP copper ring 46, the lower ETP ring 48 and the ETP copper disk 20. Thermal load heaters 54 were located about the circumference of the lower ETP copper ring 48 and the upper ETP copper ring 46 as shown in FIG. 7.

Further details of the operation of the prototype connector 10 are shown in FIG. 8. First, the assembly was evacuated through the H1 reservoir 56 to rough vacuum and isolate the assembly. Next, the H2 reservoir 58 was filled with liquid nitrogen. Subsequently, the N1 reservoir 60 was filled with liquid nitrogen and the thermocouples 52 were monitored for thermal equilibrium. Next, the heaters 54 were powered, while temperatures of the thermocouples, heater current and voltage were recorded.

Figure 9:
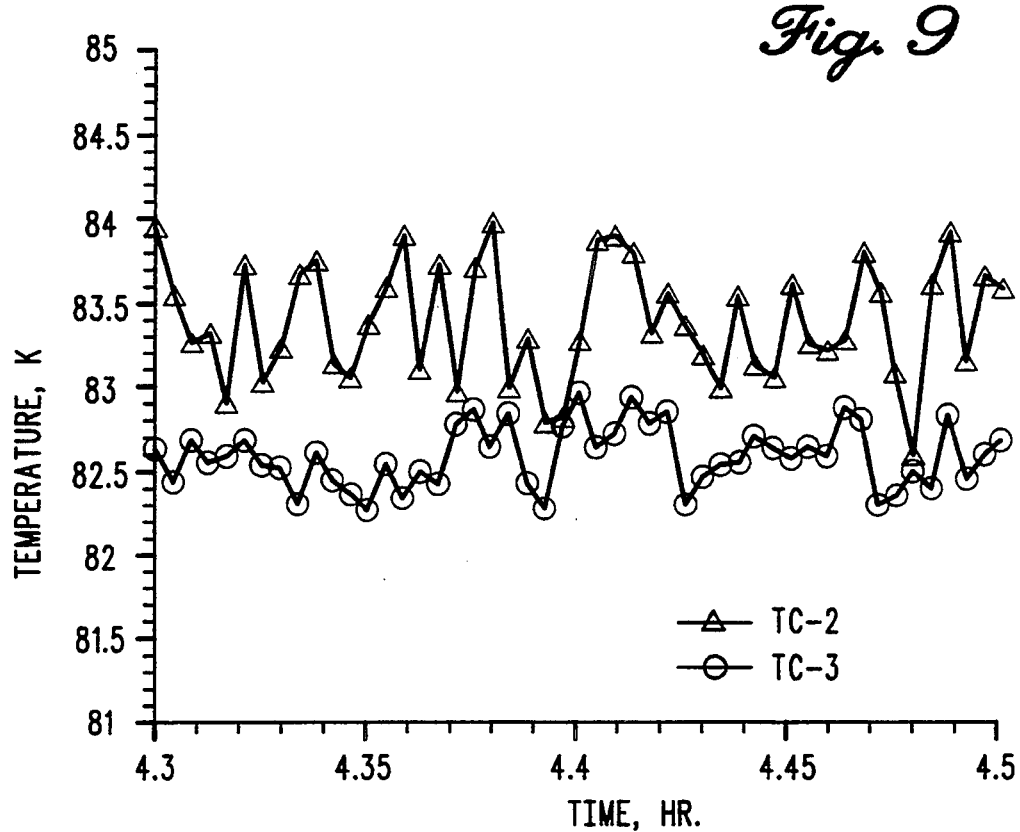
FIG. 9 illustrates a temperature versus time plot of the prototype connector obtained from two thermocouples.
Figure 10:
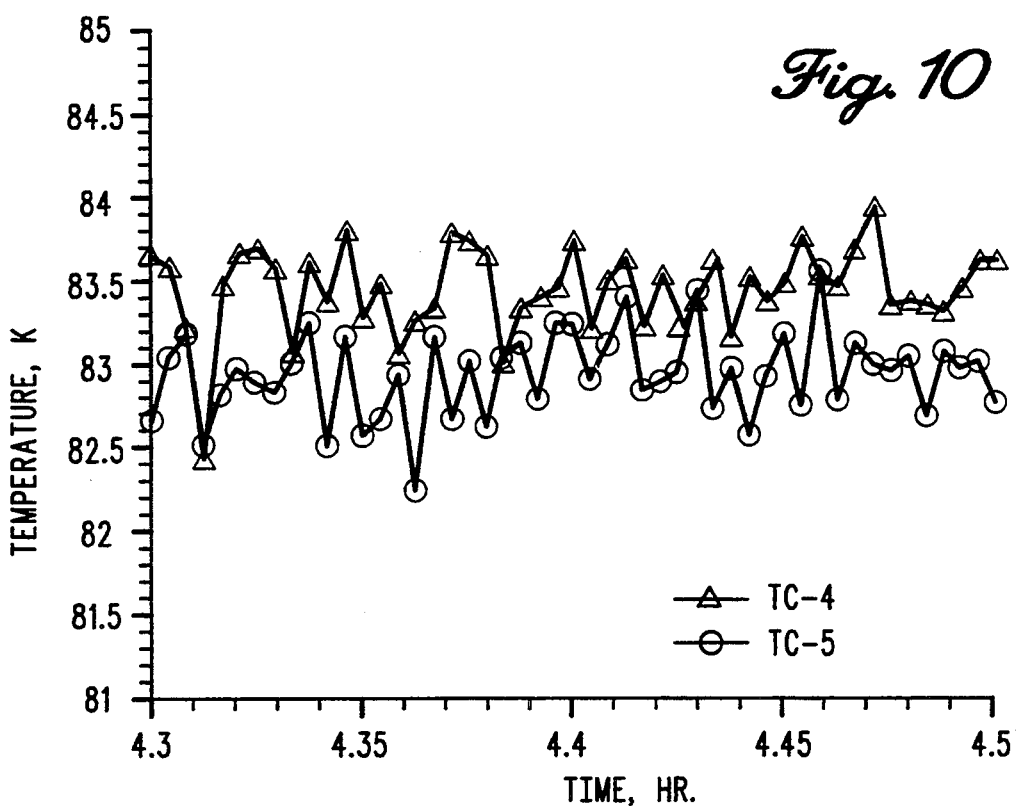
FIG. 10 shows another temperature versus time plot of two other thermocouples connected to the prototype connector.

The thermocouple 52 readings were subject to random fluctuations of varying magnitudes. To reduce the significance of the unsteady nature of the thermocouple 52 readings, data were taken at the power supply maximum rated current of 200 milliamps. These data are shown in FIGS. 9 and 10.

The evaluations were hampered slightly by the relatively limited accuracy and unsteady nature of the thermocouple readings. However, the thermocouple readings, when stable, did agree with the expected general performance of the HKHR:

Thermocouple 62 indicated the minimum recorded temperature because thermocouple 62 was located at the source of refrigeration. The temperature of thermocouple 64 was less than the temperature of thermocouple 68 because thermocouple 64 was closer to the source of refrigeration. The temperature of thermocouple 64 was less than the temperature of thermocouple 66 and the temperature of thermocouple 68 was less than the temperature of thermocouple 70 because thermocouple 66 and thermocouple 70 were separated by insulation from the source of refrigeration. These results correspond to predicted results. It should be noted that the heater powers were limited by the available power supplies' current and/or voltage limits.

It has been determined that for solid conduction through the HKHR isolator interface, $$\Delta T = \frac{Q_{LN} t}{KA}$$

where
$\Delta T$ = Temperature difference across isolator [K]
$Q_{LN}$ = Heat transfer through isolator [W]
t = Thickness of isolator [cm]
K = Thermal conductivity of isolator [W/cm K]
A = Surface area of isolator [cm$^2$]
For the Example conditions,
$Q_{LN} = RI^2 = (51\Omega)(0.2A)^2 \approx 2W$
t = 0.003 in. $\approx$ 0.0076 cm
K $\approx$ 0.01 W/cmK (Mylar @ 77 K)
A = 1 cm$^2$ (arbitrary)
Substitution yielded,
$\Delta T$ = 1.52 K.

The averages of the measured upper and lower ring $\Delta T$'s at equilibrium for 2W heater power were 0.82 K and 0.51 K respectively. Accordingly, the predicted and measured HKHR $\Delta T$'s for the single equilibrium measurement point evaluated agreed reasonably well considering the thermocouple instrumentation problems. A fraction of the heater power is radiated outward to the H1-H2 separating wall which could account for the measured value being slightly lower than the predicted value.

Thus, the HKHR connector concept can provide a high thermal conductivity (low $\Delta T$) and high electrical resistance (electrical isolation) connection. Increased thermal isolation can be provided to reduce heat radiation outward from the HKHR assembly. Further, alternative environments such as a gaseous helium environment in H1 can also be utilized.

Accordingly, the testing confirmed that the preferred embodiments of the invention can provide a high thermal conductivity (low temperature differential) and high electrical resistivity (electrical isolation) connection. These advantages are provided by mechanical connections having a rugged nature with long term reliable performance.

While preferred embodiments have been illustrated and described, it should be understood that changes and modifications can be made therein without departing from the invention in its broader aspects. Various features of the invention are defined in the following claims.

What is claimed is:

1. A method of connecting a heat source to a heat sink, comprising the steps of:
   providing an electrical isolating means having a portion disposed substantially within a first thermally conductive means;
   providing a second thermally conductive means having a portion disposed substantially within said electrical isolating means;
   securely connecting said electrical isolating means to both of said thermally conductive means with a thermal interference fit, said connecting step occurring by producing a thermal gradient between at least one of said thermally conductive means and said electrical isolating means; and
   coupling one portion of said connector to a heat source and coupling another portion of said connector to a heat sink.

2. The method as defined in claim 1, wherein said electrical isolating means comprises a tube.

3. The connector as defined in claim 1, wherein said electrical isolating means comprises a plastic film.

4. The connector as defined in claim 1, wherein said electrical isolating means comprises at least one of a ceramic material and a composite material.

5. The connector as defined in claim 1, wherein said first thermally conductive means comprises a metallic ring.

6. The connector as defined in claim 1, wherein said second thermally conductive means comprises a metallic disk.

7. A heat transferring connector for connecting a heat source to a heat sink, comprising:
   an electrical isolating means having a portion disposed substantially within a first thermally conductive means;
   a second thermally conductive means having a portion disposed substantially within said electrical isolating means;
   said thermally conductive means and said electrical isolating means being securely connected by a thermal interference fit, said thermal interference fit being provided by means for producing a thermal gradient between at least one of said thermally conductive means and said electrical isolating means; and
   one portion of said connector being coupled to a heat source and another portion of said connector being coupled to a heat sink.

8. A connector as defined in claim 7, wherein said electrical isolating means comprises a tube.

9. The connector as defined in claim 7, wherein said electrical isolating means comprises a plastic film.

10. The connector as defined in claim 7, wherein said electrical isolating means comprises at least one of a ceramic material and a composite material.

11. The connector as defined in claim 7, wherein said first thermally conductive means comprises a metallic ring.

12. The connector as defined in claim 7, wherein said second thermally conductive means comprises a metallic disk.

13. The connector as defined in claim 7, wherein said heat source comprises a conventional current lead.

14. A heat transferring connector for coupling a high temperature superconducting material heat source to a heat sink, comprising:
   an electrical isolating tube having a portion disposed substantially within a thermally conductive ring;
   a thermally conductive disk having a portion disposed substantially within said electrical isolating tube;
   said ring and disk and said electrical isolating means being securely connected by a thermal interference fit, said thermal interference fit being provided by means for producing a thermal gradient between at least one of said thermally conductive means and said electrical isolating means; and
   one portion of said connector being coupled to a heat source and another portion of said connector being coupled to a heat sink.

15. The connector as defined in claim 14, wherein said electrical isolating tube comprises a plastic material.

16. The connector as defined in claim 14, wherein said electrical isolating tube comprises at least one of a ceramic material and a composite material.

17. The connector as defined in claim 14, wherein said ring comprises a metal.

18. The connector as defined in claim 14, wherein said disk comprises a metal.

19. The connectord as defined in claim 14, wherein said ring comprises copper.

20. The connector as defined in claim 14 wherein said disk comprises copper.

* * * * *